US006267839B1

(12) United States Patent
Shamouilian et al.

(10) Patent No.: US 6,267,839 B1
(45) Date of Patent: Jul. 31, 2001

(54) ELECTROSTATIC CHUCK WITH IMPROVED RF POWER DISTRIBUTION

(75) Inventors: Shamouil Shamouilian, San Jose; Ananda H. Kumar, Milpitas; Arnold Kholodenko, San Francisco, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/229,509

(22) Filed: Jan. 12, 1999

(51) Int. Cl.[7] .............................. C23C 16/00; B23Q 3/15
(52) U.S. Cl. ..................... 156/345; 361/234; 279/128; 118/728
(58) Field of Search .............................. 118/728; 361/234; 279/128; 156/345

(56) References Cited

U.S. PATENT DOCUMENTS

| | | | |
|---|---|---|---|
| 5,155,652 | 10/1992 | Logan et al. | 361/234 |
| 5,166,856 * | 11/1992 | Liporace et al. | 361/233 |
| 5,179,498 | 1/1993 | Hongoh et al. | 361/234 |
| 5,522,131 * | 6/1996 | Steger | 29/829 |
| 5,729,423 * | 3/1998 | Donde et al. | 361/234 |
| 5,748,436 * | 5/1998 | Honma et al. | 361/234 |
| 6,088,213 * | 7/2000 | Herchen | 361/234 |
| 6,095,084 * | 8/2000 | Shamouilian et al. | 118/723 E |

FOREIGN PATENT DOCUMENTS

98/47176 * 10/1998 (WO).

* cited by examiner

*Primary Examiner*—Jeffrie R. Lund
*Assistant Examiner*—Sylvia R. MacArthur
(74) *Attorney, Agent, or Firm*—Thomason Moser Patterson

(57) ABSTRACT

A susceptor for a wafer support of a semiconductor processing chamber having multiple parallel electrical contacts between an RF electrode and a thick robust electrode near a bottom of the susceptor. The thick robust electrode has a low resistance and, therefore, evenly distributes RF power over its area. The multiple parallel contacts ensure that the RF power is also uniformly distributed across an area of the RF electrode. A plurality of electrically conductive vias extending between the robust electrode and the RF electrode make a plurality of parallel electrical contacts therebetween. Generally, the robust electrode is attached to a bottom side of the susceptor and is aligned substantially parallel to the RF electrode. An insulator plate is attached to a bottom of the susceptor for electrically isolating the robust electrode for the pedestal.

17 Claims, 2 Drawing Sheets

ELECTROSTATIC CHUCK WITH IMPROVED RF POWER DISTRIBUTION

BACKGROUND OF THE DISCLOSURE

1. Field of the Invention

The invention relates to semiconductor wafer processing equipment and, more particularly, the invention relates to electrostatic substrate supports having an RF bias electrode.

2. Description of the Background Art

A semiconductor wafer processing system for manufacture of integrated circuits (IC's) generally includes a vacuum chamber within which is mounted a wafer support during processing. The wafer support typically comprises a susceptor mounted to a pedestal. The pedestal is typically fabricated from a metal such as aluminum. The susceptor may be fabricated from laminated sheets of a polymer. However, for high temperature applications, the susceptor is typically fabricated from a ceramic material such as aluminum oxide or aluminum nitride. The susceptor typically contains various components which provide heating and/or cooling of the wafer. The susceptor may also include elements for clamping (chucking) a wafer to retain it in a stationary position upon the susceptor surface. Such clamping is provided by either a mechanical clamp or an electrostatic chuck. The susceptor may also include one or more electrodes for applying a bias voltage to the wafer. Such a bias voltage may be a direct current (DC) bias or a radio frequency (RF) bias. An RF bias may be used, for example, to supply or enhance power to a plasma that exists within the chamber during an etch or deposition process.

FIG. 1 depicts a wafer support 100 of the prior art. In the wafer support 100, a pedestal 102 supports a ceramic susceptor 104. The susceptor 104 is typically made by cold laminating several layers $106_i$ (e.g. layers $106_1$, $106_2$ ... $106_5$) of "green tape" consisting of a ceramic powder of alumina or aluminum nitride with a suitable organic binder such as butadiene (synthetic rubber) or poly-methyl methacrylate. The electrode patterns 108 are screen or stencil printed onto the appropriate green tape layer using inks or pastes made with molybdenum or tungsten powders along with a suitable organic binder. Interconnections between the electrodes 108 and connections 112 to the exterior of the susceptor are made by punching holes in the green tape layers and filling them with the same or similar tungsten/molybdenum paste through screen printing masks to form vias 110. The laminated layers are sintered at elevated temperatures to solidify the ceramic to form the monolithic susceptor 104 with thick film metal electrodes 108 embedded in the ceramic. During the sintering process, the organic binders are charred and removed as CO and $CO_2$.

The metal paste and the ceramic layers 106 generally sinter at different temperatures and, thus, shrink non-uniformly during sintering. Such non-uniformity in the shrinkage, if severe enough, causes severe bowing, distortion or cracking of the laminate. To alleviate such problems, the metal inks or pastes are usually mixed with large proportions (up to 40% by volume) of ceramic powder to match the shrinkage behavior of the surrounding ceramic during sintering.

Prior art attempts to solve the problem include using thicker electrodes. However, the thickness of the electrodes 108 is limited to only 10 or 15 microns by the sintering process. If the metal electrodes are made thin and fragile they easily break and reform many times due to the shrinkage in the surrounding ceramic. Thus, strains are dissipated before they become large enough to damage the ceramic.

The resulting electrodes 108 and interconnecting vias 110 and connections 112 are, therefore, highly resistive. High resistivity is not a problem where the electrode 108 serves only as a DC electrode for chucking or DC bias. However, high resistivity presents a problem when it is desired to use the electrode 108 for RF bias.

The problem arises because, in common designs, the vias 112 connecting the electrodes 108 to the outside are located in the central area 114 of the susceptor. A thin highly resistive electrode will have a high impedance due to ohmic resistance. Consequently, a large proportion of the power delivered to the electrodes 108 will be dissipated as heat. Thus, the efficiency of RF power transferred to the plasma in the chamber is low. This is unsuitable for delivery of RF energy to the plasma at power levels of 500 to 1500 watts. Furthermore, the RF power distribution over the area of electrodes 108 is non-uniform which leads to non-uniformity of the plasma temperature across the wafer. The plasma develops "hot spots" where the plasma temperature is greater. Consequently, the etch, deposition or other plasma process will be non-uniform over the surface of the wafer. Thus, a number of the IC's on a given wafer may be rendered unusable thereby decreasing wafer yield.

Other solutions involve stacking multiple thin RF electrodes in layers separated by layers of ceramic. The RF power is then capacitively coupled from one electrode layer to the next. Although this does reduce the overall impedance of the metal structure, it also leads to power losses through the capacitive couplings. Furthermore, it does not solve the problem of non-uniform RF power distribution over the area of the electrodes.

Therefore, a need exists in the art for a susceptor for a semiconductor processing system having a low impedance electrode structure that uniformly distributes RF power over the area of the electrode and a concomitant method of manufacturing same.

SUMMARY OF THE INVENTION

The disadvantages associated with the prior art are overcome by the present invention of a susceptor having multiple parallel electrical contacts between an RF electrode and a thick, robust electrode near the bottom of the susceptor. The thick, robust electrode has a low resistance and, therefore, evenly distributes RF power over its area. The multiple parallel electrical contacts ensure that the RF power is also uniformly distributed across an area of the RF electrode. The susceptor generally comprises a ceramic support body, at least one RF electrode embedded within the body, a robust electrode disposed below the RF electrode, and a plurality of electrically conductive vias extending between the robust electrode and the RF electrode. The vias make a plurality of parallel electrical contacts between the robust electrode and a plurality of points substantially uniformly distributed over an area of the RF electrode. The robust electrode, RF electrodes and vias are typically made of a metal such as molybdenum, tungsten or copper. Generally, the robust electrode is attached to a bottom side of the support body and is aligned substantially parallel to the RF electrode. An insulator plate is attached to the bottom side of the support body for electrically isolating the robust electrode from a pedestal that supports the susceptor.

A method of fabricating a susceptor of the present invention begins with the step of forming a ceramic body. The body is formed by creating a plurality of layers of ceramic green tape and stacking the layers on top of one another. One or more electrodes are embedded within the ceramic body by screen printing one or more electrode patterns on selected ones of the layers using a paste containing a metal powder. A plurality of vias is formed by punching holes in selected layers such that the holes in adjacent layers are aligned when the layers are subsequently stacked together. After the holes are filled with a paste containing a metal powder the layers are stacked. After stacking, the layers are cured to form the ceramic body. The metal powder consolidates to form the electrodes and vias. The vias form a plurality of contacts at a plurality of points substantially uniformly distributed over an area of the RF electrode.

A robust electrode, having a low resistance, is disposed below the other electrodes at a bottom of the ceramic body. The robust electrode is joined to the exposed ends of the vias. Thus, the vias form a plurality of parallel electrical connections between the robust electrode and a plurality of points distributed over the area of at least one RF electrode in the susceptor.

The low resistance robust electrode and multiple parallel electrical connections to the RF electrodes in the susceptor of the present invention provide a more uniform distribution of RF power over the area of the RF electrode. This leads to a more uniform plasma temperature and, hence, more uniform processing of wafers. Furthermore, the overall structure has a low impedance and consequently there is efficient transmission of RF energy from the robust electrode to the RF electrode and from the RF electrode to the plasma with minimal power loss.

BRIEF DESCRIPTION OF THE DRAWINGS

The teachings of the present invention can be readily understood by considering the following detailed description in conjunction with the accompanying drawings, in which.

To facilitate understanding, identical reference numerals have been used, where possible, to designate identical elements that are common to the figures.

DETAILED DESCRIPTION

Figure 1:
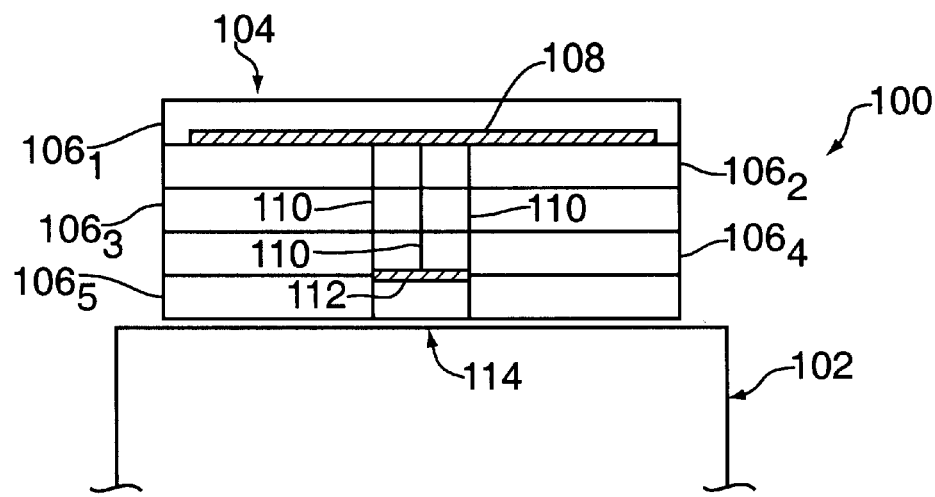
FIG. 1 depicts a typical ceramic susceptor of the prior art.
Figure 2:
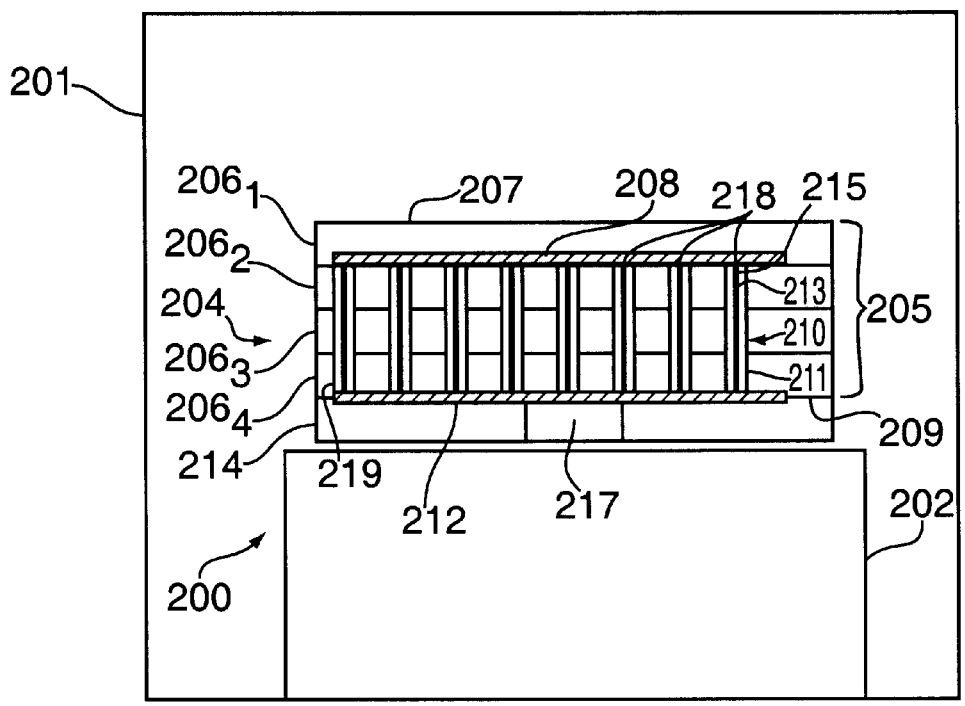
FIG. 2 depicts a wafer support that employs a susceptor of the present invention.

A wafer support 200 employing a susceptor 204 of the present invention is depicted in FIG. 2. The wafer support is, for example, situated within a process chamber 201 of a semiconductor wafer processing system. The wafer support includes a pedestal 202 that supports the susceptor 204. The susceptor generally includes a support body 205, a robust electrode 212, an RF electrode 208, and a plurality of conductive vias 210. The conductive vias 210 make parallel electrical connections between the robust electrode 212 and the RF electrode 208. The support body 205 is, for example, comprised of a plurality of layers $206_i$ (e.g. layers $206_1$, $206_2$, $206_3$, $206_4$) of ceramic material such as aluminum oxide ($Al_2O_3$ or alumina), aluminum nitride or similar material. The support body 205 includes a support surface 207 for supporting a substrate, such as a semiconductor wafer (not shown). The support surface 207 may be flat or contoured as necessary for properly supporting the substrate. Furthermore, the support surface 207 may include grooves or channels for backside gas cooling.

The robust electrode 212 is disposed near a bottom 209 of the support body 205. The robust electrode 212 is preferably made from a low resistivity metal such as a sheet of copper, molybdenum or tungsten. The robust electrode 212 should be thick enough to permit easy handling but not too thick so that it is not insulated from plasma at its sides. A convenient thickness range for the robust electrode 212 is between approximately 0.005 inches to approximately 0.025 inches. Alternatively, the robust electrode 212 could be screen printed or stencil printed onto one of the ceramic layers $206_i$ such as layer $206_4$, but only after the support body 205 has been fully densified by sintering. In this condition the shrinkage problems are obviated. However, electrodes thicker than 0.005 inches (125 microns) are difficult to make due to the limitations of the screen printing process. In fact, stencil printing is preferred for a thickness above 50 microns.

In the example shown in FIG. 2, the robust electrode 212 has an area that substantially corresponds to an area of the susceptor 204. An insulator plate 214, disposed below the robust electrode 212, electrically insulates the robust electrode from the pedestal 202. The insulator plate 214 contains a central opening 217 to allow for connection between the robust electrode 212 and DC or RF voltage sources.

The RF electrode 208 is disposed, for example, proximate the support surface 207 and situated between two of the ceramic layers such as layers $206_1$ and $206_2$. The RF electrode 208 is used to apply RF bias voltages to the substrate on the wafer support surface 207. The RF electrode 208 may also be used to apply a DC bias to the substrate. The RF electrode is typically made of tungsten or molybdenum. Although only a single RF electrode 208 is shown for the sake of clarity, the susceptor 204 of the present invention may include any number and arrangement of RF electrodes. For example, multiple parallel RF electrodes may be stacked on top of one another separated by layers of ceramic. Alternatively, multiple electrodes may be placed side by side between the same ceramic layers. Furthermore, some combination of stacked and side-by-side electrodes may be employed.

In addition to the RF electrode(s), the susceptor may also include any number of other electrodes such as resistive heater electrodes or chucking electrodes. The latter may be implemented using any number of chucking electrodes and any type of chucking electrode structure including monopolar, bipolar, tripolar, interdigitated, zonal and the like. Similarly, any number or arrangement of heater electrodes can be used including a single heater electrode, or two or more heater electrodes may be used for zoned heating and the like. Alternatively, the susceptor may be fabricated as a chuck without heater electrodes or fabricated as a ceramic heater without chucking electrodes. The chucking and heating electrodes are preferably made of metals such as molybdenum and tungsten and screen printed in a fashion similar to that of the RF electrode 208.

The vias 210 connect the RF electrode 208 and the robust electrode 212. The vias 210 make contact with the RF electrode 208 at a plurality of contact points 218. The contact points 218 are substantially uniformly distributed across the area of the RF electrode 208. Each via 210 comprises a bore 211 in one or more of the ceramic layers $206_i$ filled with a conducting material 213. An upper end 215 of each via is connected to the RF electrode 208. A lower end 219 of each via 210 is bonded to the robust electrode 212. FIG. 2 shows that the vias 210 are substantially geometrically parallel to each other. Although simple to manufacture, this is not strictly necessary as long as the vias make electrically parallel connections, i.e. side-by-side connections, between the robust electrode 212 and the RF electrode 208. These uniformly distributed electrically parallel connections evenly distribute the RF power over the area of the RF electrode 208.

Figure 3:
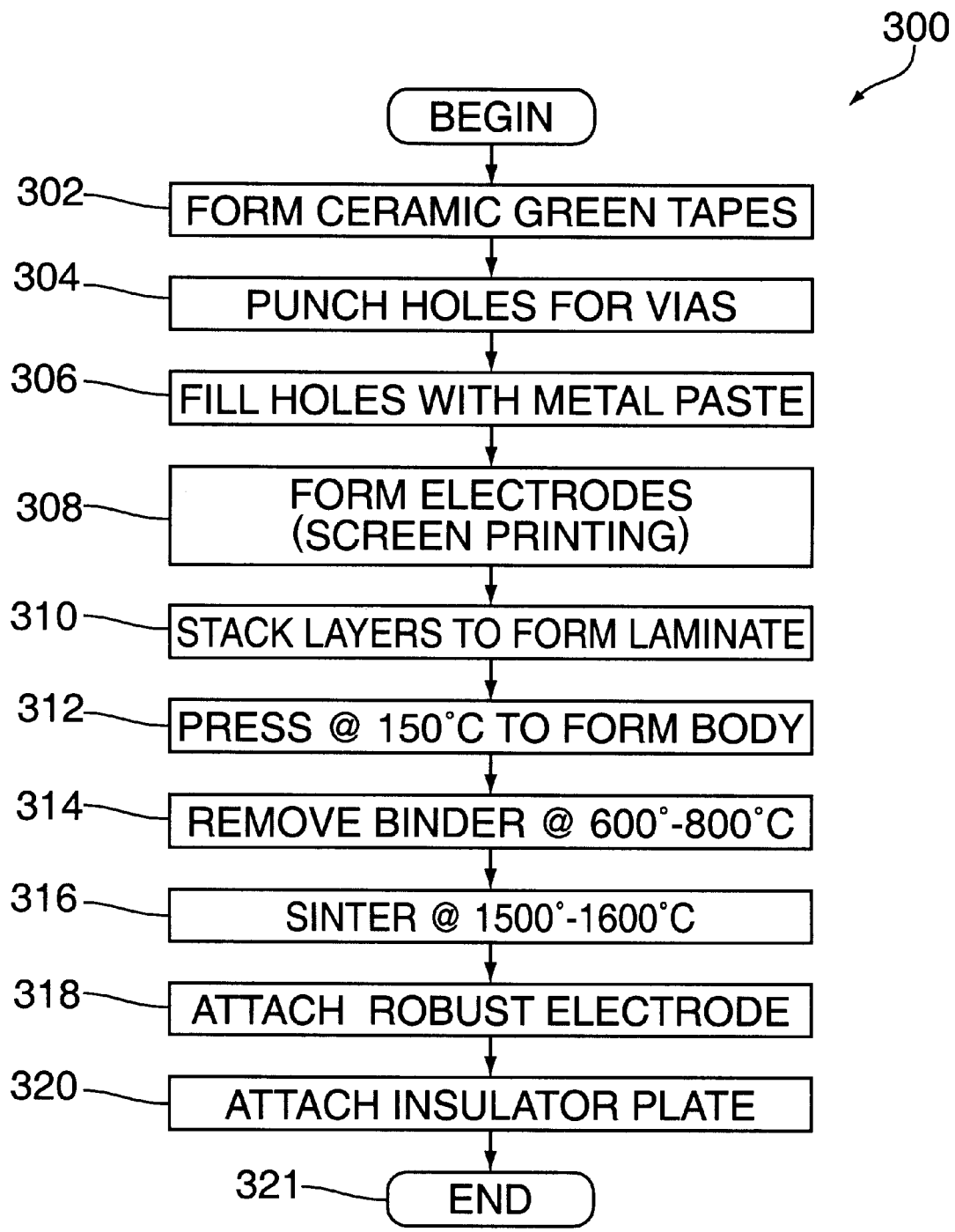
FIG. 3 depicts a flow diagram of the method of making the susceptor of the present invention.

The susceptor 204 of the present invention depicted in FIG. 2 can be fabricated by the method 300 of the present invention shown in the flow diagram of FIG. 3. The method 300 begins at step 301. In step 302, a plurality of unfired ceramic green tapes are formed that will be used to form a stack of uncured ceramic layers (such as layers 206$_i$). The stack of uncured ceramic layers forms the support body upon curing. The green tapes are made from a powdered ceramic such as aluminum nitride or aluminum oxide mixed with an organic binder such as artificial rubber (butadiene), poly-methyl methacrylate, or similar material and cast into sheets. In step 304, bores 211 are punched into selected ones of the layers. The bores 211 are uniformly distributed over the layers to provide multiple electrically parallel conducting vias. The bores 211 are punched in successive layers such that the bores 211 line up when the green tapes are subsequently stacked. The bores 211 may be formed either before or after the layers have been stacked. Preferably the bores 211 are formed in the green tapes before the layers 206$_i$ are stacked.

In step 306, the bores 211 are filled with a conductive material, e.g., paste containing a metal powder such as tungsten or molybdenum, to form the vias. The paste completely fills the bores 211. In step 308 electrodes (e.g., RF electrode 208) are embedded within the support body. For example, the RF electrode 208 may be screen printed on selected green tapes using the same conductive material used to form the vias (i.e., the tungsten or molybdenum paste). Specifically, one or more RF electrodes 208 are screen printed along with any desired chucking or heating electrodes.

The green tapes are stacked together on top of one another in step 310 to form the stack. The stack is pressed at approximately 150° C. in a platen press in step 312 to produce a green laminate.

The green laminate is then heated in a furnace to remove the organic binder in step 314. The temperature is typically between 600° and 800° C. during this step. This stage of the sintering may be performed in a reducing atmosphere of hydrogen or cracked ammonia. Water vapor is injected into the reducing atmosphere to provide a controlled partial pressure of oxygen to oxidize the binder while avoiding oxidizing the electrodes during this step. Next, in step 316, the ceramic body is sintered at 1500° to 1600° C. to consolidate the ceramic and the metal to form the susceptor.

The robust electrode 212 is attached to the bottom 209 of the ceramic body 205 in step 318. The robust electrode 212 can optionally be electroplated, for example, with nickel to protect it against corrosion. The robust electrode can be formed by screen or stencil printing. For example, paste containing a metal powder can be stencil or screen printed over the exposed lower ends 219 of the vias 210. The body 205 is then fired in a reducing atmosphere to sinter the powder to a dense metallic structure and simultaneously join the robust electrode 212 to the vias 210. The pastes are typically loaded with between 10 and 30 percent by volume of glass powders (frits) to obtain adhesion to the ceramic. Firing typically takes place at temperatures of between approximately 1600° C. to 1800° C. for tungsten and molybdenum containing pastes. Copper containing pastes are sintered at about 900° C.

In a preferred embodiment, the ends 219 of the vias 210 are plated with copper or nickel and the robust electrode 212 is made from molybdenum, copper or tungsten sheet. The robust electrode is attached to the bottom 209 of the support body 205 by brazing to the nickel plated ends 219 of the vias 210. To do this, the selected braze (e.g., copper-silver alloys or gold-tin alloys) or lead-tin solder can be screened on to the ends 219 of the vias 210 to form a plurality of solder dots. The solder or braze is then melted or reflowed while the robust electrode 212 is touching these solder dots. Joining the robust electrode 212 to the numerous, well scattered ends 219 of the vias 210 is sufficient to rigidly hold the robust electrode 212 during subsequent handling and assembly operations. Thus, it is unnecessary to bond the robust electrode 212 to the ceramic of the support body 205.

After attaching the robust electrode, the insulator plate 214 is attached to the bottom 209 of the support body 205 in step 320. Attachment can be accomplished by mechanical means such as bolting. Alternatively, the insulator plate can be attached by glass sealing, diffusion bonding or the like. The method then ends at step 321.

The resulting ceramic susceptor 204 incorporates an electrode structure that exhibits superior transmission of RF power to the substrate and more uniform distribution of RF power across the substrate than prior art electrode structures. The uniform power distribution leads to more uniform wafer processing, fewer defective wafers. Consequently productivity is higher, cost per wafer is lower and profitability is increased.

Although the invention is described in terms of a uniform distribution of multiple parallel electrical contacts any distribution of multiple parallel electrical contacts over the area of the RF electrode that provides for a uniform distribution of RF power across the area of the RF electrode is considered within the scope of the invention.

Although various embodiments which incorporate the teachings of the present invention have been shown and described in detail herein, those skilled in the art can readily devise many other varied embodiments that still incorporate these teachings.

What is claimed is:

1. Apparatus for supporting a wafer in a semiconductor process chamber, comprising:
    a support body;
    at least one electrode disposed within said support body;
    a robust electrode disposed below said at least one electrode; and
    a plurality of uniformly distributed parallel electrical contacts connected between said at least one electrode and said robust electrode.

2. The wafer support set forth in claim 1 wherein said support body comprises a plurality of stacked layers.

3. The apparatus set forth in claim 1 wherein said robust electrode is attached to a bottom side of said support body.

4. The apparatus set forth in claim 3 further comprising a an insulator plate attached to said bottom side for electrically isolating said robust electrode.

5. The apparatus set forth in claim 1 wherein said electrical contacts are vias further comprising bores filled with a conductive material.

6. The apparatus of claim 5 wherein said material is chosen from the group consisting of molybdenum and tungsten.

7. The apparatus of claim 1 wherein said robust electrode is made from a material chosen from the group consisting of copper, molybdenum and tungsten.

8. A wafer support for supporting a wafer in a semiconductor process chamber, comprising:

a susceptor comprising a ceramic body, wherein said ceramic body comprises a plurality of layers stacked on top of one another, at least one electrode embedded within said ceramic body, a robust plated electrode, made of a metal chosen from the group consisting of copper, molybdenum or tungsten, disposed below said at least one electrode, and a plurality of uniformly distributed parallel electrical contacts between said robust electrode and said electrode wherein said electrical contacts are made of a metal chosen from the group consisting of molybdenum and tungsten..

9. The wafer support of claim 8 further comprising an insulator plate attached to a bottom side of said susceptor.

10. A method of fabricating a wafer support, said support having a support body, at least one electrode, a robust electrode and a plurality of electrical contacts connected to said electrode, said method comprising the steps of:

forming said support body;

disposing at least one electrode within said support body;

forming a plurality of uniformly distributed parallel electrical contacts to said at least one electrode; and disposing a robust electrode below said at least one electrode.

11. The method of claim 10 further comprising the step of connecting said robust electrode to said plurality of parallel electrical contacts.

12. The method set forth in claim 10 wherein the step of forming the support body further comprises:

creating a plurality of layers of uncured ceramic;

forming a stack of said plurality of layers; and curing said layers.

13. The method of claim 12 wherein the step of forming the plurality of uniformly distributed parallel electrical contacts comprises:

punching a plurality of bores in selected ones of said plurality of layers such that said bores are aligned when said stack is formed;

filling said bores with a paste containing a metal powder; and stacking said layers.

14. The method of claim 10 wherein the step of disposing said electrode comprises screen printing an electrode pattern on at least one of said plurality of layers.

15. The method of claim 14 wherein said electrode pattern is screen printed prior to said step of curing said layers.

16. The method of claim 10 wherein said robust electrode is made from a sheet of metal.

17. The method of claim 10 further comprising the step of attaching a ceramic insulator plate beneath said robust electrode.

* * * * *